United States Patent [19]
McGinn

[11] Patent Number: 4,791,325
[45] Date of Patent: Dec. 13, 1988

[54] CLASS B CLAMP CIRCUIT
[75] Inventor: Michael McGinn, Scottsdale, Ariz.
[73] Assignee: Motorola, Inc., Schaumburg, Ill.
[21] Appl. No.: 135,851
[22] Filed: Dec. 21, 1987
[51] Int. Cl.[4] .............................................. H03K 5/08
[52] U.S. Cl. .................................... 307/540; 307/546; 307/549; 307/562
[58] Field of Search ............... 307/540, 546, 547, 549, 307/557, 359, 562, 567

[56] References Cited
U.S. PATENT DOCUMENTS
4,644,198  2/1987  Ahmed ................................. 307/549

Primary Examiner—John Zazworsky
Attorney, Agent, or Firm—Michael Bingham

[57] ABSTRACT

An integrated circuit is disclosed having an output coupled to a capacitive load for sourcing or sinking current at said output to charge or discharge the load accordingly to a fixed voltage established by the circuit. The circuit includes an NPN transistor push-pull output stage and first and second current mirrors coupled to the push-pull output stage for establishing feedback in order to set a small quiescent current flow in the output stage. A NPN transistor having its collector-emitter conduction path coupled to the collector of the upper one of the NPN transistors provides the dynamic current thereto when turned on to provide the sourcing current flow through the latter.

4 Claims, 1 Drawing Sheet

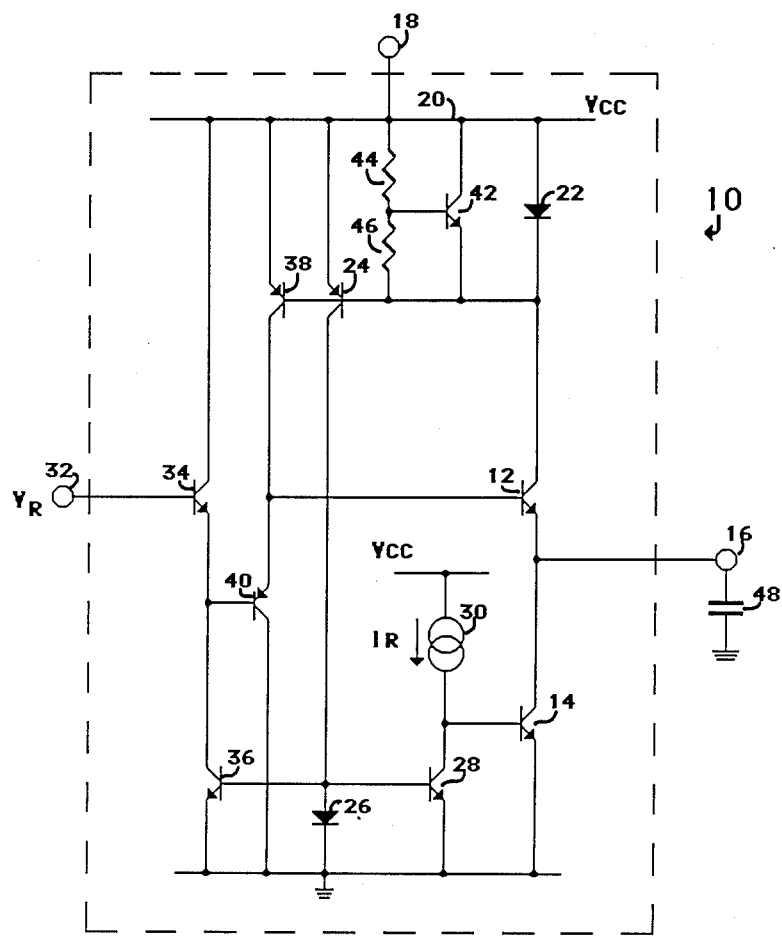

CLASS B CLAMP CIRCUIT

BACKGROUND OF THE INVENTION

The present invention relates to clamping circuits, and more particularly, to an integrated circuit operated in a class B mode for rapidly charging and discharging a large capacitive load and clamping the voltage thereacross.

Most, if not all, television intermediate frequency demodulating schemes include an automatic frequency control loop (AFC) for locking the oscillator of the loop at the IF frequency as is understood. AFC is typically provided by generating a control or reference voltage on a large capacitor which is varied in accordance with the selected TV channel. It would be further desirable to set a reference voltage on the capacitor whenever the IF section is out of lock so that minimum acquisition time is required to lock onto the IF signal upon acquiring the same.

Therefore, to reduce acquisition time, it would be advantageous to include a clamp circuit of some type to set the aforementioned reference voltage and to supply large dynamic charge or discharge current to the capacitor in a TV receiver. Additionally, the use of a large geometry PNP transistor to provide the charge current to the capacitor should be avoided.

More and more integrated circuit manufacturers are integrating more of the television circuitry onto a single integrated circuit. Hence, these circuits are becoming very complex. This requires the reduction of die area available whereby it is desirable to eliminate the need for large geometry devices such as the PNP transistor described above.

Hence, a need exists for an all NPN clamping circuit to eliminate the need for any large geometry PNP device. Moreover, it is desirable to provide a circuit that can supply large charging and discharging currents when needed but yet need only a relatively small quiescent current for operation.

SUMMARY OF THE INVENTION

Accordingly, it is an object of the present invention to provide a circuit having an all NPN transistor output stage for sourcing and sinking large dynamic currents at an output thereof and which requires minimal quiescent operating current.

Another object of the present invention is to provide a clamp circuit for establishing a reference output voltage and which is able to source a large dynamic current at the output thereof without the need for a large geometry PNP transistor.

Still another object of the present invention is to provide an integrated class B clamp circuit having an all NPN transistor output stage.

In accordance with the above and other objects there is provided an integrated clamp circuit comprising an NPN transistor push-pull output section coupled to an output of the circuit; first and second current mirrors coupled to the output section for establishing a quiescent current in the latter; input circuit means coupled to an input of the output section for establishing a reference voltage at the output of the circuit; and circuit means for providing excess dynamic current to the output section.

BRIEF DESCRIPTION OF THE DRAWING

The sole FIGURE is a schematic diagram of the integrated class B clamp circuit of the present invention.

DETAILED DESCRIPTION OF THE PREFERRED EMBODIMENT

Turning now to the single FIGURE, there is shown clamp circuit 10 of the preferred embodiment which is suited to be manufactured in integrated circuit form. Clamp circuit 10 comprises a push-pull output stage that includes NPN transistors 12 and 14 for sourcing and sinking a large dynamic current at output 16. This current is sourced to output 16 from the emitter of transistor 12 and sourced from the output through the collector-emitter path of transistor 14. The collector of transistor 12 is coupled to an input of a first current mirror which includes diode 22 and PNP transistor 24. A source of operating potential is applied to the circuit at terminal 18 to supply the voltage Vcc at power supply conductor 20. Diode 22, which may be realized by a PNP transistor having its base and collector interconnected, is coupled between conductor 20 and the collector of transistor 12. Transistor 24 has its base and emitter coupled in parallel with diode 22 and provides an output current equal to the current flowing through the latter at its collector. The output of the current mirror, the collector of transistor 24 is coupled to an input of a second current mirror comprising diode 26 and transistor 28 connected in the same manner with respect to each other as diode 22 and transistor 24. Again, it is recognized that diode 26 can be formed by an NPN transistor having its base and collector shorted together. The output of the second current mirror is taken at the collector of transistor 28 which is coupled to the base of transistor 14. A reference current source 30 is coupled to the collector of transistor 28 for providing a current IR at its output. Circuit 10 also includes an input circuit which receives a reference voltage $V_R$ at input 32 and is supplied to transistor 34 the collector of which is coupled to conductor 20. The emitter of transistor 34 is coupled both to the collector of transistor 36 and the base of transistor 40 the former of which has its emitter coupled to ground reference and its base to the base of transistor 28. The emitter of transistor 40 is coupled to the collector of transistor 38. The base and emitter of transistor 38 is coupled in parallel with the electrodes of diode 22 and mirrors the current flowing through the latter at its collector as is understood. The collector of transistor 40 is returned to ground reference. It is noted that all of the PNP devices so described are small geometry transistors.

An excess current producing circuit provides excess dynamic current, as will be explained later, and includes transistor 42 and resistor divider comprising resistors 44 and 46 series connected between conductor 20 and the collector of transistor 12. The base of transistor 42 is connected between resistors 44 and 46 while its collector and emitter are connected respectively to conductor 20 and the collector of transistor 12. Output terminal 16 is adapted to be connected to an external load which, for example, may be capacitive as illustrated by capacitor 48.

In a quiescent operating state, assuming that a high impedance is presented at output terminal 16, the voltage $V_R$ will cause transistor 12 to be turned on. Since transistors 34 and 40 are connected as emitter followers, the base of transistor 12 will be at the potential $V_R$. Thus, output terminal 16 will be at a potential equal to $V_R-V_{BE}$ (where $V_{BE}$ is the voltage drop across the base-emitter of transistor 12). A quiescent current is established through transistor 12 from diode 22. This quiescent current is mirrored through transistor 24 and is sourced to diode 26. The current through diode 26 is mirrored by transistor 28. Assuming that transistor 14 is a high gain device essentially all of the current from current source 30 flows through transistor 28. Feedback is therefore established through the two current mirrors whereby transistor 28 is biased to conduct the current $I_R$. Hence, the current gain through transistor 14 is such that the quiescent current flow through this transistor and transistor 12 is equal to $I_R$. Thus, in a quiescent operating state, a fixed voltage is established at output 16 with minimal quiescent current flow through transistors 12 and 14.

If, at the time that $V_R$ is applied to circuit 10, the voltage across the load is not equal to the fixed voltage $V_R-V_{BE}$ a dynamic condition will be established. For example, if the voltage across capacitor 48 is less than the fixed voltage, transistor 12 will be turned on hard to supply a charging current to the capacitor until such time as the voltage thereacross equals the voltage at the emitter of the transistor. This charging or excess current will be supplied by transistor 42 as it is rendered operative to supply the current in excess of the quiescent current flowing through transistor 12. Once the voltage across capacitor 48 reaches the magnitude of the voltage appearing at the emitter of transistor 12 charging will discontinue and transistor 42 is rendered non-operative. Similarly, if the voltage across capacitor 48 is greater than $V_R-V_{BE}$ when $V_R$ is applied to input 32, transistor 14 will be turned on hard to provide dynamic discharging of the capacitor until the voltage thereacross reaches the fixed value set at the emitter of transistor 12 from the input circuit.

Hence, what has been described above is a novel clamp circuit operated in a class B mode for charging or discharging a capacitive load until such time as the voltage across the load reaches a predetermined fixed reference voltage. Thereafter, the voltage across the load is clamped to the reference voltage and the clamp circuit returns to a quiescent operating state.

I claim:

1. A circuit for providing a fixed reference voltage at an output thereof that is capable of sourcing and sinking large dynamic currents at the output, comprising:
    a push-pull output stage for sourcing or sinking current at the output of the circuit which includes first and second NPN transistors the respective collector-emitter conduction paths of which are coupled in series, and respective bases;
    a first current mirror circuit having an input coupled to the collector of said first transistor and an output;
    a second current mirror circuit having an input coupled to said output of said first current mirror circuit and an output coupled to said base of said second transistor;
    a reference current source for supplying a reference current at an output, said output being coupled to said base of said second transistor;
    input circuit means having an input to which a reference voltage is supplied and an output coupled to said base of said first transistor for establishing said reference voltage thereat; and
    current supply circuit means for supplying excess dynamic current to said collector of said first transistor when rendered conductive.

2. The circuit of claim 1 wherein said current supply means includes:
    a third NPN transistor having an emitter coupled to said collector of said first transistor, a collector coupled to a power supply conductor and a base; and
    first and second resistors serially connected between said power supply conductor and said emitter of said third transistor with the interconnection therebetween being coupled to said base of said third transistor.

3. An integrated clamp circuit having an input and an output, comprising:
    a push-pull output stage for sourcing or sinking current at the output of the circuit which includes first and second NPN transistors the respective collector-emitter conduction paths of which are coupled in series, and respective bases;
    a first current mirror circuit having an input coupled to the collector of said first transistor and an output;
    a second current mirror circuit having an input coupled to said output of said first current mirror circuit and an output coupled to said base of said second transistor;
    a reference current source for supplying a reference current at an output, said output being coupled to said base of said second transistor;
    input circuit means having an input to which a reference voltage is supplied and an output coupled to said base of said first transistor for establishing said reference voltage thereat; and
    current supply circuit means for supplying excess dynamic current to said collector of said first transistor when rendered conductive.

4. The circuit of claim 3 wherein said current supply means includes:
    a third NPN transistor having an emitter coupled to said collector of said first transistor, a collector coupled to a power supply conductor and a base; and
    first and second resistors serially connected between said power supply conductor and said emitter of said third transistor with the interconnection therebetween being coupled to said base of said third transistor.

* * * * *